United States Patent [19]
Wakabayashi et al.

[11] Patent Number: 6,127,874
[45] Date of Patent: *Oct. 3, 2000

[54] SKEW ADJUSTABLE IC AND A METHOD FOR DESIGNING THE SAME

[75] Inventors: Shigemichi Wakabayashi, Kanagawa-ken; Toshiyuki Oshima; Osamu Fuji, both of Tokyo; Shoichi Miyamoto, Kanagawa-ken, all of Japan

[73] Assignee: Kabushiki Kaisha Toshiba, Kawasaki, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 08/939,443

[22] Filed: Sep. 29, 1997

[30] Foreign Application Priority Data

Sep. 30, 1996 [JP] Japan ................................. P8-258993

[51] Int. Cl.[7] .................................................. H03K 3/013
[52] U.S. Cl. ........................... 327/292; 327/153; 327/161
[58] Field of Search ..................................... 327/141, 153, 327/161, 293, 295; 395/551–558

[56] References Cited

U.S. PATENT DOCUMENTS

| | | | |
|---|---|---|---|
| 5,012,427 | 4/1991 | Kuribayashi | 327/141 |
| 5,077,676 | 12/1991 | Johnson et al. | 364/489 |
| 5,548,237 | 8/1996 | Iadanza et al. | 327/277 |
| 5,557,779 | 9/1996 | Minami | 395/500 |
| 5,564,022 | 10/1996 | Debnath et al. | 307/405 |
| 5,712,583 | 1/1998 | Frankeny | 327/158 |
| 5,784,600 | 7/1998 | Doreswamy et al. | 395/558 |

*Primary Examiner*—Kenneth B. Wells
*Attorney, Agent, or Firm*—Banner & Witcoff, Ltd.

[57] ABSTRACT

The present invention provides a semiconductor IC and a method for designing the same which adjusts the clock skews on a chip without additional delay circuit. A decrease in design time is realized when the semiconductor IC includes hard megacells (whose functions have been confirmed) or standard cell blocks. In the case of a semiconductor IC including hard megacells and a standard cell blocks, each megacell and standard cell block according to the present invention has sub-clock buffers on every row, for example, sub-clock buffers on the row and sub-clock buffers on the row in the megacell. The adjustment needed for accommodating clock skews on a chip is determined by calculating a delay time for the various IC chip blocks. Next, sub-clock buffers are chosen based on a result of a calculation for the delay time. Finally, the wiring design is completed which minimizes clock skew.

12 Claims, 4 Drawing Sheets

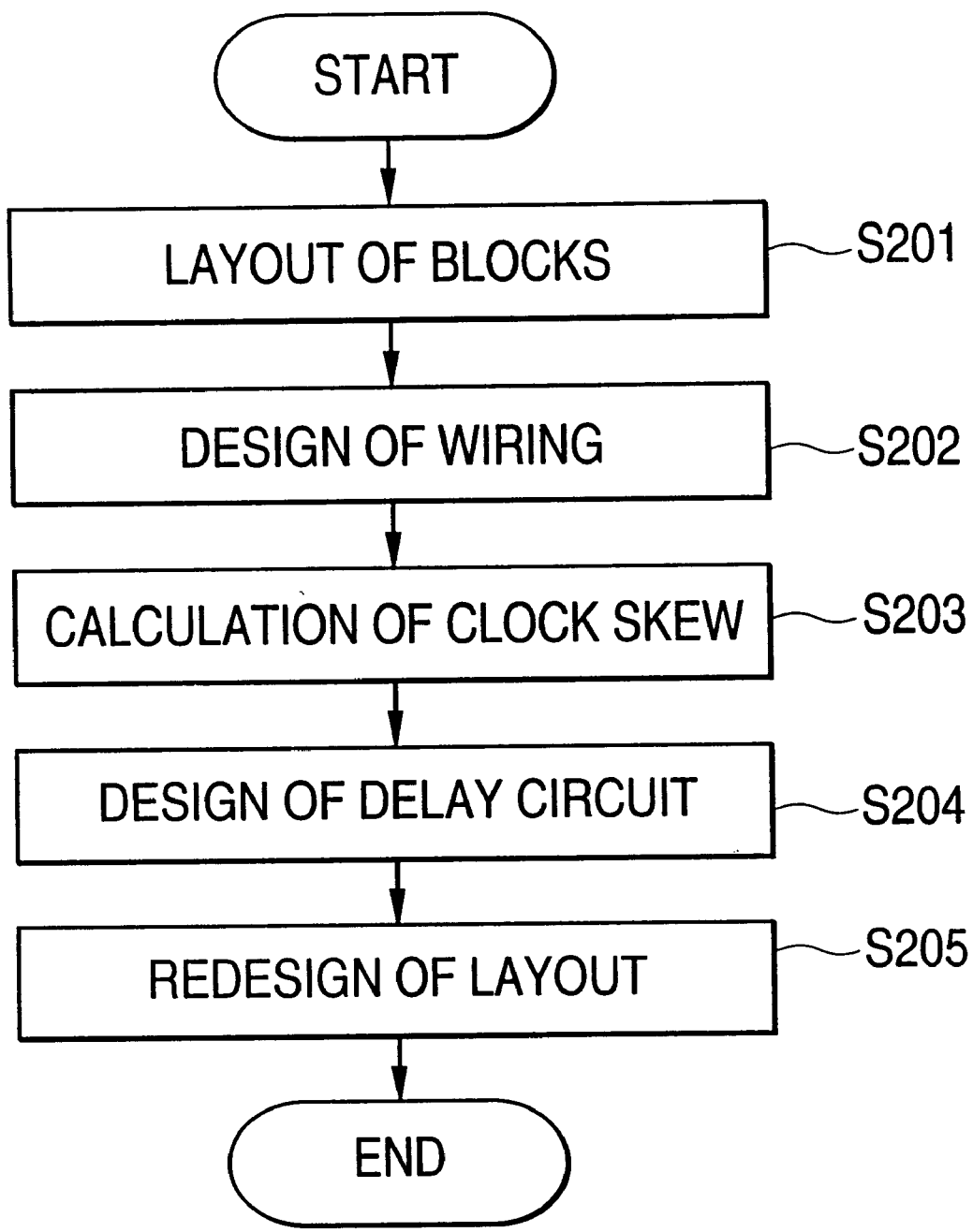

SKEW ADJUSTABLE IC AND A METHOD FOR DESIGNING THE SAME

BACKGROUND OF THE INVENTION

1. Field of the invention

The present invention relates to a semiconductor integrated circuit and a method for designing the same. In particular, the present invention relates to a cell-based IC including integrated megacells with a skew adjusting system, and a method for designing the same.

2. Description of the Related Art

It is known that hard megacells such as CPUs, hard macrocells, and standard cell blocks (such as gate array blocks) may be integrated into a semiconductor chip.

The hard megacells are circuit blocks which have an optimized layout design of the semiconductor elements (such as transistors and wiring patterns). They have also been opted to perform their predetermined functions. Further, the finishing process is taken into consideration so as to ensure proper functioning of the hard megacells. Having been previously designed and optimized, the hard megacells may be integrated directly with other components without redesigning the semiconductor elements in the hard megacells because the functions as enabled by the megacells have been previously confirmed through the effort invested in designing the megacell by itself Thus, when attempting to integrate a hard megacell with other devices onto an integrated circuit, the integrated circuit containing hard megacels may be more easily designed (for example, reducing design time required) by incorporating a pre-designed megacell.

Although hard megacells and standard block cells have optimized clock skews in them, clock skews occurs among the megacells, the standard block cells, or each other because of the layout of the cells. If a standard system clock is skewed differently among the various blocks on a chip, the operation of the chip as a whole may be impaired, as the system may not operate at the desired clock rate (by having to wait for each out of phase block to catch up to the operation state of the other blocks).

To solve this problem, independent delay circuits with specific delays have been used to adjust clock skews around a conventional chip.

FIG. 3 shows a block diagram of a conventional semiconductor IC consisting of hard megacells and standard cell blocks which may operate at high speed. The hard megacells and standard cell blocks are referred to as "blocks" hereinafter. The semiconductor IC 58 includes a processor 59, driving hard megacells 60, 61, 62 and a standard cell block 63. A clock signal is supplied to each block through the main clock buffer 7 from a clock input 8. Delay circuits 64, 65, 66, and 67 modify the clock skews based on their locations between the blocks and the delay circuits' internal delay. The delay circuits 64, 65, 66, and 67 are located between the clock input 8 and the clock input to each block in order to arrange the clock skews between the blocks.

The clock tree process is important in the design of the IC chip including the blocks. In the clock tree process, a layout of the blocks is designed so that the clock at the input of each block has the same phase due to calculation of additional influences on the phase of clock skew (such as wiring capacitance or resistance).

FIG. 4 shows a flow chart of a conventional design method for semiconductor ICs. A layout of required hard megacells and standard block cells on a chip is designed (S201). The locations of the wiring lines (wiring of clock and other lines) are determined (S202). After the clock wiring lines for the blocks are designed, the system calculates the clock skew as evident at each block (S203). For example, a difference among the delays of the clock lines is one form of clock skews. According to the result of the calculation of delays at step S203, delay circuits are added in the clock lines to adjust the clock skews (S204). The circuit is redesigned to consider the delay of the additional delay circuits (S205).

Because each block has peculiar delay time and the delay time depends on the layout of the blocks on the chip, it is important to calculate again the whole delay time after the layout of the blocks. The repetitive redesigning of the layout of the blocks and wiring in response to the calculations of the delay times results in an increased design time interval.

Since the conventional method to add delay circuits accounts only for clock skews, the characteristics of the IC may vary due to influences of temperature and from the manufacturing processes. Since the delay circuits are added to fit the skews to the largest delays in the chip, wiring resistance or wiring capacitance are changed due to the addition of the delay circuits. Therefore, adding delay circuits to the previously optimized blocks causes new area to reconfirmation IC operation. These additional reconfirmations increase the design term again. Further, in the instances when the skews cannot be adjusted to accommodate a megacell (for example, more delay circuits cannot be added), the hard megacells must be redesigned. If a hard megacell is redesigned, the design interval again increases as the functions and operations of the cells must be confirmed again.

SUMMARY OF THE INVENTION

The present invention provides a semiconductor IC without the additional external delay circuits located outside of all the blocks, and a method for designing the same. One embodiment includes using pre-designed (and optimized) hard megacells with known device and operating characteristics.

One embodiment of the present invention provides a hard megacell in a semiconductor IC comprising a clock input terminal port, at least one array of components in the hard megacell, and a buffer in the array for adjusting a clock skew of a system clock.

Another embodiment of the present invention provides a semiconductor IC having a hard megacell and a standard cell including at least one buffer in at least one array in the hard megacell and the standard cell, for adjusting a clock skew, wherein the number of buffers is selected to adjust the clock skew.

Yet another embodiment of the present invention provides a semiconductor IC having a hard megacell comprising buffers in arrays in the hard megacell for adjusting a clock skew, wherein one or a plurality of buffers connected to a system clock is selected based on a characteristic of clock wiring lines, wherein each input of the buffer not connected to the system clock is connected to a fixed potential.

Another embodiment of the present invention provides a semiconductor IC comprising a hard megacell on a semiconductor substrate, the megacell comprising a buffer in an array for adjusting a clock skew, a clock input terminal, a main clock buffer, and a clock wiring line connected between the clock input terminal and the megacell via the main clock buffer.

Yet another embodiment of the present invention provides a method for designing a hard megacell in a semiconductor IC, in which the hard megacell has arrays having a buffer for adjusting a clock skew, comprising the steps of deciding the number of the buffers to connect to a system clock, and connecting the buffer to the system clock.

A further embodiment of the present invention provides a method for designing a hard megacell in a semiconductor IC, in which the hard megacell has arrays having a buffer for adjusting a clock skew, comprising the steps of measuring wiring resistance between a clock input node of the megacell and a clock input node of the array, measuring resistance of an input of the megacell, calculating a clock skew from the wiring resistance and the number of cells in the array, and calculating the number of connecting buffers from the clock skew.

BRIEF DESCRIPTION OF THE DRAWINGS

FIG. 4 shows a flow chart of designing a conventional semiconductor IC.

DETAILED DESCRIPTION OF THE PREFERRED EMBODIMENTS

Figure 1:
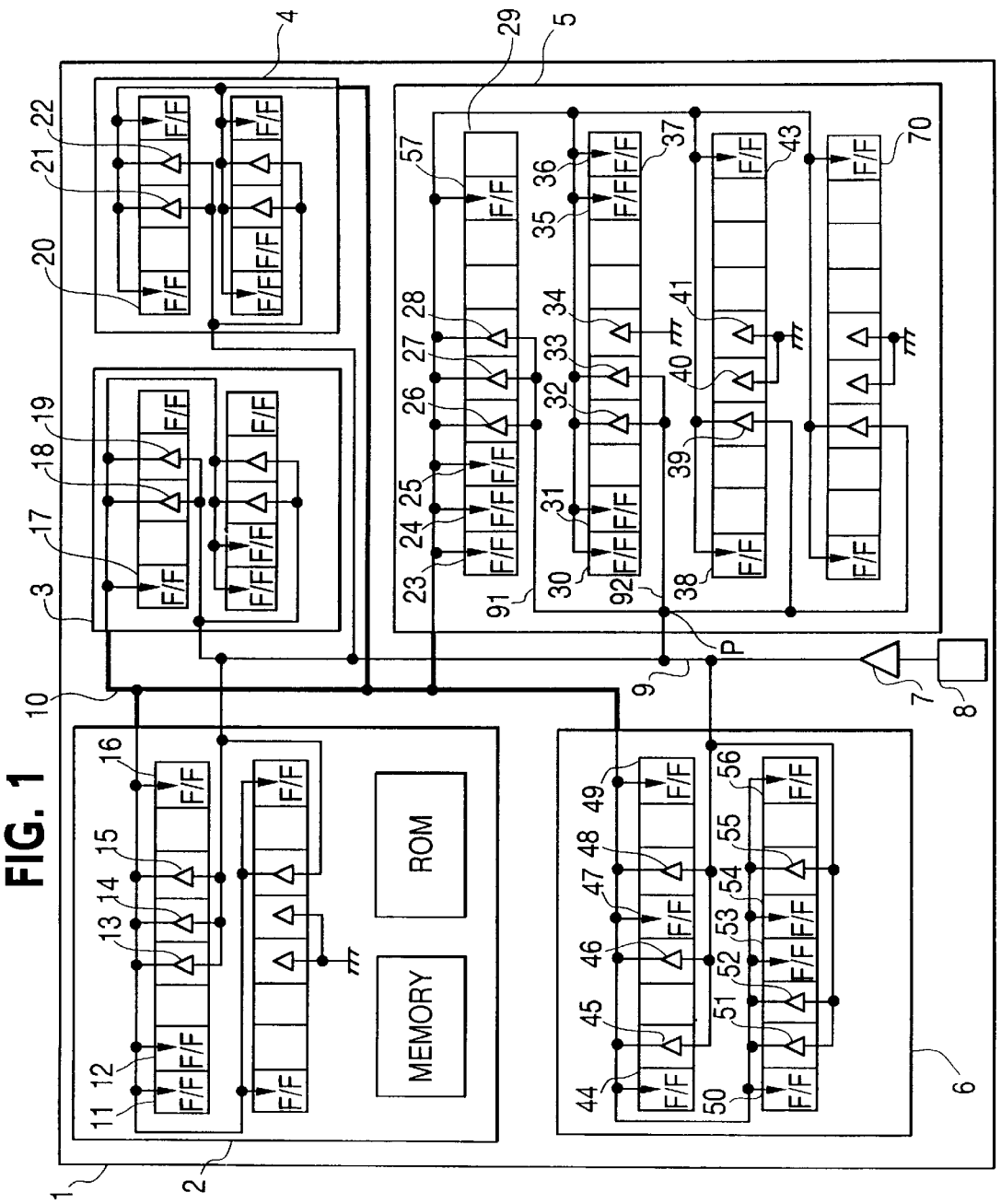
FIG. 1 shows a block diagram of a semiconductor IC according to the present invention.

FIG. 1 shows a block diagram of a semiconductor IC chip 1 according to the present invention. The IC chip 1 includes a RISC processor 2 which is a hard megacell, driving hard megacells 3, 4, 5, and standard cell block 6. As the RISC processor 2 and the driving hard megacells 3, 4, and 5 have been previously designed, their functionality, manufacturing processes and related design criteria have previously been confirmed. The elements (such as transistors and resistors in the hard megacells) have been previously chosen and arranged. The blocks have an array structure as shown in FIG. 1. For example, the driving hard megacell 5 has rows 29, 37, 43, and 70. Also, the functions of the megacells have been previously designed and examined so that the megacell may be readily incorporated into a semiconductor IC.

A semiconductor IC is examined in every design step, for example, after designing a circuit, after designing wiring, after designing a mask pattern, etc. After examinations by computer simulations, a semiconductor IC chip sample is produced. At this point, the functions and characteristics of the sample are examined strictly because the physical sample may have a failure due to a manufacturing process or overlooked aspect of the simulations. Only a design having sample which passes the examinations moves to mass production. As the hard megacells passed a final examination with confirmed functions, the hard megacells may be mass produced.

On the other hand, a standard cell block is expressed by data in computer system. Although the functions are examined by the computer simulations, they do not undergo the final examination steps like those of the hard megacells.

A clock input from an input terminal 8 is supplied to each block by a clock line 9 through the main clock buffer 7. Clock line 10 connects the output terminals of each block. The length of the clock lines 9 and 10 depends on the layout of the blocks.

Figure 3:
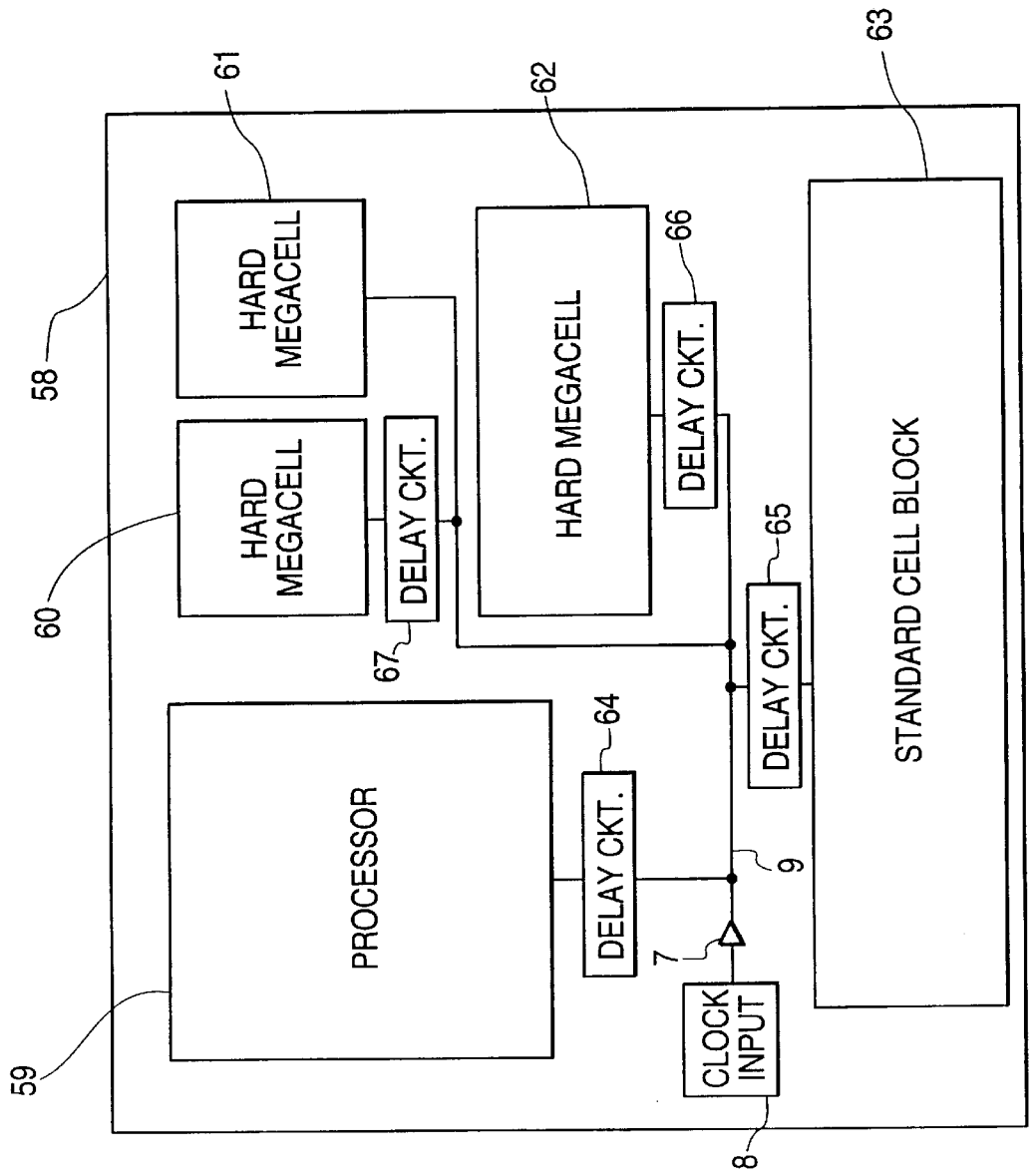
FIG. 3 shows a block diagram of a conventional semiconductor IC.

Each block, which may include a hard megacell or a standard cell block, has one or a plurality of sub-clock buffers. For instance, sub-clock buffers 13, 14, 15 in the RISC processor 2, and sub-clock buffers 18, 19 in the driving hard megacell 3 may exist. The sub-clock buffer may reduce the clock skews due to increasing driving ability to the clock line. One or a plurality of the sub-clock buffers are provided on a row in the block. Because the clock skew may be controlled in every row, finer adjustment of clock skew is realized over the coarse adjustment of FIGS. 3 and 4. The sub-clock buffers are provided in rows in a hard megacell and are chosen to adjust the clock skew, so that the total clock skew in a system is optimized easily without additional delay circuits.

The sub-clock buffers may increase the driving ability, so that the clock skews decrease in every row in a block. Therefore, the variance of characteristics due to temperature or the variance of the characteristics introduced by the manufacturing process because of new delay circuits do not occur. As the clock skews may be adjusted uniformly in every block, the wiring resistance and the wiring capacitance of the respective lines vary less than previously possible. Further, the clock skews may be controlled by changing the connections of the sub-clock buffers in every row, so that the redesign of the layout of blocks is unnecessary.

Figure 2:
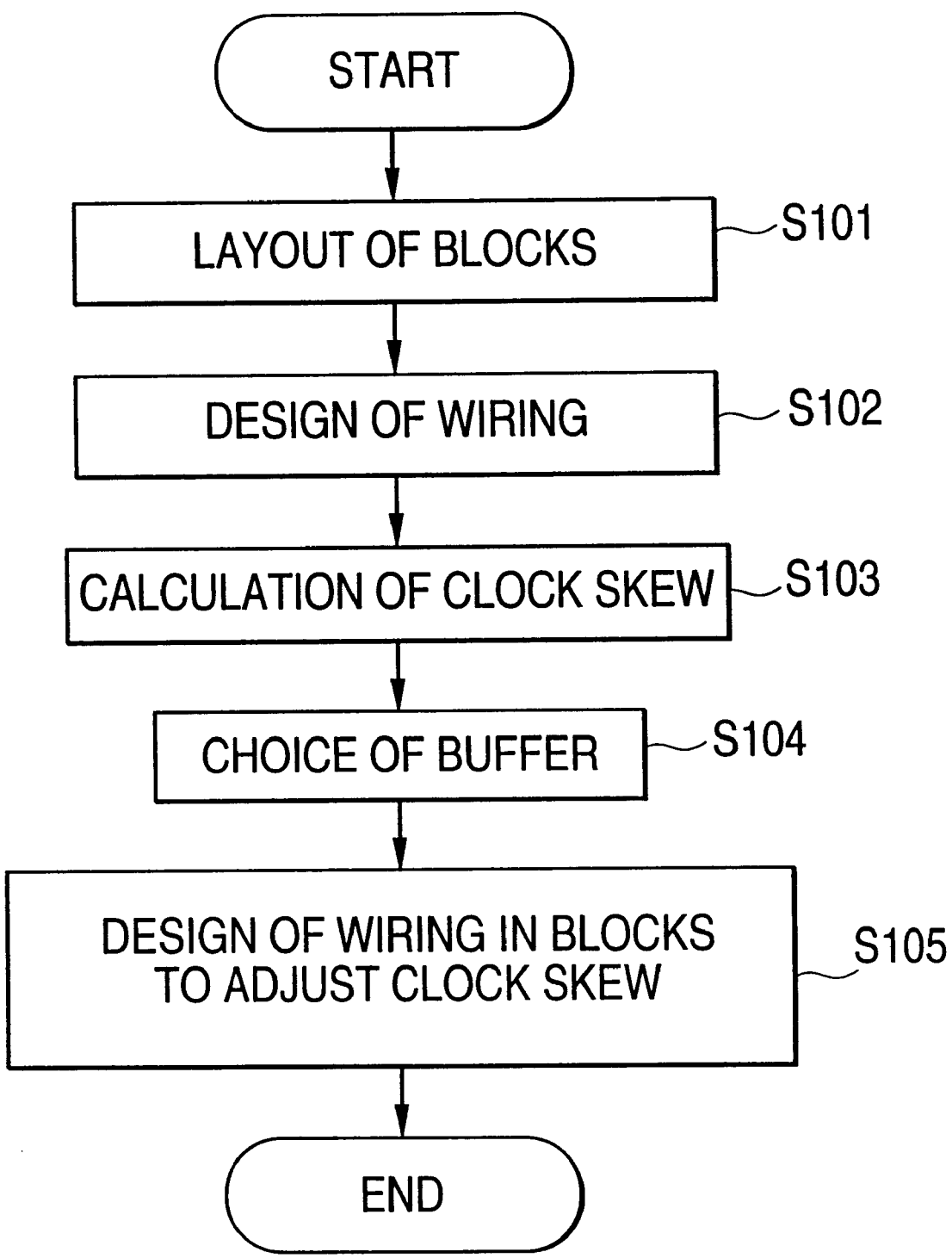
FIG. 2 shows a flow chart of designing a semiconductor IC according to the present invention.

FIG. 2 shows a flow chart of a method for designing a semiconductor IC according to the present invention. Hard megacells and standard cell blocks which are required for a system are chosen and a layout is designed on a chip area (S101). Wiring paths (such as clock wiring lines and lines in the standard cell block) are determined on the chip area (S102).

After designing clock wiring lines, wiring resistance and wiring capacitance of the clock wiring lines are calculated (S103). In FIG. 1, the wiring resistance and the wiring capacitance between the input terminal 8 and the blocks 2, 3, 4, 5, and 6 are calculated. Also, the resistance of the wiring, the capacitance of the wiring, the input capacitance of every block and a number of the cells connected to the clock line in every blocks are calculated as well. Next, a reasonable delay time for the whole chip is estimated using the result of the calculation in S103. The required number of sub-clock buffers on every row are then calculated (S104). For example, a case that the step S104 is applied to the hard megacell 5 in FIG. 1 will described below.

Both row 29 and row 37 have four flip-flop cells (F/Fs) 23, 24, 25, 57, 30, 31, 35, and 36. However, the wiring resistance and the input capacitance of row 29 are different from that of row 37. The number of the required sub-clock buffers must be determined by the wiring resistance and the input capacitance of the rest of the array and circuit. Through the calculation of S103, row 37, for instance, may require two sub-clock buffers to adjust the clock skew. Because the length of the wiring line 91 between the diverging point P and the row 29 is longer than the length of the wiring line 92 between the diverging point P and the row 37, the row 29 requires three sub-clock buffers though the row 29 has the same number of F/Fs, four F/Fs, as the row 37. The sub-clock buffers are determined by the wiring resistance and the number of the cells (such as F/Fs). The wiring capacitance or the load of the cells connected to the clock may be used to determine the number of the sub-clock buffers to be used. Though three sub-clock buffers 32, 33, and 34 are provided in the row 37, sub-clock buffer 34 is not used in this case. The input of the sub-clock buffer 34 is fixed to the ground level (GND) and the output is opened to prevent a current from passing through it. The number of requested sub-clock buffers is determined similarly on every row in the blocks 2, 3, 4, 6 to adjust the delay corresponding to the result of S103.

After sub-clock buffers are chosen based on the result of S104, the clock line 9 is connected to the cells (such as F/F) on the rows through the chosen sub-clock buffers, for example, sub-clock buffer 13, 14, 15 in the hard megacell 2, which outputs are connected to each other. The output of all chosen sub-clock buffers are connected to each other to prevent clock skews. Thus, the skews on the chip 1 are adjusted as a whole (S105). The input of the non-chosen sub-clock buffers, for example 34, 40, and 41 in the hard megacell 5, are fixed to GND or the other power potential (VDD) to prevent the current from passing through. Therefore, the clock skew on the chip 1 is adjusted as a whole without additional delay circuits.

The semiconductor IC and the method for designing the same according to the present invention may adjust appropriately the clock skews on a chip as a whole without any additional delay circuits in a case of a semiconductor IC, such as a cell-base IC, consisting of hard megacells or standard cell blocks. The previously required redesign steps of the hard megacells are not required.

A term for the clock tree process is reduced because the algorithm for this process according to the present invention may be easier than the conventional one. In this regard, the semiconductor IC and the method is effective for design of Application Specific Integrated Circuits (ASICs) which demand a quick design time.

While there has been shown and described various embodiments of the present invention it will be evident to those skill in the art that various modification may be made thereto without departing from the scope of the invention which is set forth in the appended claims.

What is claimed is:

1. A hard megacell for use in a semiconductor integrated circuit, the hard megacell comprising:

a clock input node for receiving a system clock of the semiconductor integrated circuit; and a plurality of rows of elements, each of the rows further including at least one buffer for adjusting a skew of the system clock, each of the buffers being for selective connection to the clock input node.

2. The hard megacell of claim 1, wherein each of the buffers is selectively connected to either the clock input node or a fixed potential.

3. The hard megacell of claim 1, wherein the hard megacell is a CPU.

4. A method for designing a semiconductor integrated circuit, the method comprising the steps of:

choosing a hard megacell having a plurality of rows of elements, each of the rows further including at least one buffer for adjusting a skew of a system clock of the semiconductor integrated circuit;

selecting at least one of the buffers; and connecting each of the buffers selected in the step of selecting to the system clock.

5. The method of claim 4, further including the step of connecting each of the buffers not selected in the step of selecting to a fixed potential.

6. The method of claim 4, wherein the step of selecting includes selecting the buffers based on a characteristic of a system clock wiring line for carrying the system clock.

7. The method of claim 6, wherein the step of selecting includes selecting the buffers based on a resistance of the system clock wiring line.

8. The method of claim 4, wherein the step of selecting includes selecting a number of the buffers less than a total number of the buffers.

9. The method of claim 4, wherein the buffers in the rows of elements of the hard megacell chosen by the step of choosing are selectively connected to the system clock.

10. A method for designing a semiconductor integrated circuit, the method comprising the steps of:

choosing a hard megacell having a plurality of rows of elements, each of the rows further including at least one buffer for adjusting a skew of a system clock of the semiconductor integrated circuit;

measuring a wiring resistance between a clock input node of the hard megacell and a clock input node of one of the rows;

determining a skew of the system clock based on the wiring resistance and a total number of cells in the one of the rows;

determining a number of the buffers for minimizing the skew of the system clock; and connecting the number of the buffers determined in the step of determining to the system clock.

11. The method of claim 10, further including the step of connecting each of a remaining number of the buffers to a fixed potential.

12. The method of claim 10, wherein the buffers in the rows of elements of the hard megacell chosen by the step of choosing are selectively connected to the system clock.

* * * * *